(12) United States Patent
Zhao

(10) Patent No.: US 11,322,933 B2
(45) Date of Patent: May 3, 2022

(54) PROTECTION CIRCUIT

(71) Applicants: CHONGQING HKC OPTOELECTRONICS TECHNOLOGY CO., LTD., Chongqing (CN); HKC CORPORATION LIMITED, Shenzhen (CN)

(72) Inventor: Wenqin Zhao, Chongqing (CN)

(73) Assignees: CHONGQING HKC OPTOELECTRONICS TECHNOLOGY CO., LTD., Chongqing (CN); HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 17/041,808

(22) PCT Filed: Nov. 27, 2018

(86) PCT No.: PCT/CN2018/117760
§ 371 (c)(1),
(2) Date: Sep. 25, 2020

(87) PCT Pub. No.: WO2020/052087
PCT Pub. Date: Mar. 19, 2020

(65) Prior Publication Data
US 2021/0013712 A1    Jan. 14, 2021

(30) Foreign Application Priority Data

Sep. 13, 2018 (CN) .......................... 201821500926.7

(51) Int. Cl.
*H02H 9/04* (2006.01)
*H02H 9/00* (2006.01)
(Continued)

(52) U.S. Cl.
CPC ............ *H02H 9/041* (2013.01); *H02H 9/005* (2013.01); *H02H 9/04* (2013.01); *H01L 21/768* (2013.01);
(Continued)

(58) Field of Classification Search
CPC ............ H02H 9/04; H02H 9/00; H02H 9/041; H02H 9/005; H02H 9/02; H02H 3/20;
(Continued)

(56) References Cited

U.S. PATENT DOCUMENTS 4,213,164 A * 7/1980 Gaertner ................ H02H 9/041
361/56
8,218,276 B2 * 7/2012 Mallikarjunaswamy ....................
H01L 27/0262
361/56

(Continued)

FOREIGN PATENT DOCUMENTS

CN    202333791 U    7/2012
CN    104078922 A    10/2014
(Continued)

OTHER PUBLICATIONS

International Search Report from International Application No. PCT/CN2018/117760 dated May 6, 2019.

*Primary Examiner* — Danny Nguyen
(74) *Attorney, Agent, or Firm* — Hauptman Ham, LLP

(57) ABSTRACT

A protection circuit, comprising: a transient suppression circuit, configured to suppress a transient voltage; and a short-circuit protection circuit connected between the transient suppression circuit and a ground terminal, wherein when the transient suppression circuit is shorted out and the transient voltage is a protection voltage, the short-circuit protection circuit disconnects a loop where the transient suppression circuit is located. The short-circuit protection circuit has a turned-on state and a turned-off state; the (Continued)

short-circuit protection circuit is in a turned-on state when the transient suppression circuit is shorted out and the transient voltage is greater than the protection voltage; and the short-circuit protection circuit is in a turned-off state when the transient suppression circuit is shorted out and the transient voltage is a protection voltage.

12 Claims, 2 Drawing Sheets

(51) Int. Cl.
    *H01L 23/60*     (2006.01)
    *H01L 21/768*     (2006.01)
    *H02H 3/20*     (2006.01)
    *H02H 9/02*     (2006.01)

(52) U.S. Cl.
    CPC ............ *H01L 23/60* (2013.01); *H02H 3/20* (2013.01); *H02H 9/02* (2013.01)

(58) Field of Classification Search
    CPC ........ H02H 9/046; H02H 9/042; H01L 23/60; H01L 21/768; H01L 27/02; H01C 7/12
    USPC .......................................... 361/56, 91.1, 111
    See application file for complete search history.

(56) References Cited

U.S. PATENT DOCUMENTS

| | | | |
|---|---|---|---|
| 9,013,845 B1* | 4/2015 | Karp | H02H 3/202 361/56 |
| 10,062,682 B1* | 8/2018 | Mallikarjunaswamy | H01L 23/535 |
| 2003/0076639 A1* | 4/2003 | Chen | H01L 27/0266 361/56 |
| 2010/0006889 A1* | 1/2010 | Marreiro | H01L 27/0255 257/106 |
| 2014/0078622 A1* | 3/2014 | Crane | H02H 3/087 361/8 |
| 2015/0222115 A1 | 8/2015 | Zhu | |
| 2017/0302072 A1* | 10/2017 | Chen | H02H 9/04 |

FOREIGN PATENT DOCUMENTS

| | | |
|---|---|---|
| CN | 204030581 U | 12/2014 |
| CN | 105896507 A | 8/2016 |

\* cited by examiner

PROTECTION CIRCUIT

CROSS REFERENCE TO RELATED APPLICATIONS

This application is a US national stage of PCT International Application No. PCT/CN2018/117760 filed on Nov. 27, 2018 and entitled "PROTECTION CIRCUIT," which claims priority to Chinese Patent Application No. 2018215009267, filed with the Chinese Patent Office on Sep. 13, 2018 and entitled "PROTECTION CIRCUIT," which is incorporated herein by reference in its entirety.

TECHNICAL FIELD

This application relates to the field of circuit protection technologies, and in particular, to a protection circuit.

BACKGROUND

The description herein provides only background information related to this application, but does not necessarily constitute the exemplary technology.

Currently, a transient inverter circuit is disposed in some circuits, which is mainly configured to prevent a surge current introduced when the power grid is unstable from burning elements. When the transient inverter circuit is subjected to an overshoot voltage, it changes high resistance at its two ends to low resistance at an extremely high speed to protect the circuits connected subsequently from being damaged. However, when the transient inverter circuit is burnt to be short-circuited, it cannot continue protecting the subsequent circuits.

SUMMARY

According to various embodiments of this application, a protection circuit is provided.

A protection circuit includes:

a transient suppression circuit configured to suppress a transient voltage; and a short-circuit protection circuit connected between the transient suppression circuit and a ground terminal, wherein the short-circuit protection circuit disconnects a loop where the transient suppression circuit is located when the transient suppression circuit is short-circuited and the transient voltage is a protection voltage.

In the protection circuit described above, a short-circuit protection unit is disposed between a transient suppression unit and the ground terminal, and the short-circuit protection unit can disconnect the loop where the transient suppression unit is located when the transient suppression unit is short-circuited and the transient voltage is the protection voltage, that is, disconnect the protection circuit, and the protection circuit will not act on an input signal, thereby avoiding a short-circuit of the protected signal to the ground and ensuring the normal operation of subsequent circuits.

A protection circuit includes:

a transient suppression circuit configured to suppress an input transient voltage within a protection voltage; and a short-circuit protection circuit connected between the transient suppression circuit and a ground terminal, wherein: the short-circuit protection circuit includes a first voltage-dividing circuit, a second voltage-dividing circuit and a switching circuit; the first voltage-dividing circuit and the second voltage-dividing circuit are sequentially connected in series between the transient suppression circuit and the ground terminal; a control terminal of the switching circuit is connected between the first voltage-dividing circuit and the second voltage-dividing circuit; an input terminal of the switching circuit is connected to the transient suppression circuit; an output terminal of the switching circuit is connected to the ground terminal; the first voltage-dividing circuit and the second voltage-dividing circuit cooperatively control the switching circuit to be in an on state when the transient suppression circuit is short-circuited and the transient voltage is greater than the protection voltage, and to be in an off state when the transient suppression circuit is short-circuited and the transient voltage is the protection voltage.

Details of one or more embodiments of this application are provided in the following accompanying drawings and descriptions. Other features, objectives, and advantages of this application will become apparent from the specification, the accompanying drawings, and the claims.

BRIEF DESCRIPTION OF THE DRAWINGS

To describe the technical solutions of the embodiments of this application or the exemplary technology more clearly, the following briefly introduces the accompanying drawings required for describing the embodiments or the exemplary technology. Apparently, the accompanying drawings in the following description show only some embodiments of this application, and persons of ordinary skill in the art may still derive other drawings from these accompanying drawings without creative efforts.

DETAILED DESCRIPTION OF THE EMBODIMENTS

To make the objectives, technical solutions, and advantages of this application clearer and more comprehensible, the following further describes this application in detail with reference to the accompanying drawings and embodiments. It should be understood that the specific embodiments described herein are merely used to explain this application but are not intended to limit this application.

In the description of this application, it should be understood that orientation or position relationships indicated by the terms such as "center", "transverse", "on", "below", "left", "right", "vertical", "horizontal", "top", "bottom", "inside", and "outside" are based on orientation or position relationships shown in the accompanying drawings, and are used only for ease and brevity of illustration and description, rather than indicating or implying that the mentioned apparatus or component must have a particular orientation or must be constructed and operated in a particular orientation. Therefore, such terms should not be construed as limiting of this application. In addition, it should be noted that when an element is referred to as being "formed on" another element, it can be directly connected to the another element or intervening elements may also be present. When an element is referred to as being "connected" to another element, it can be directly connected to the another element or intervening elements may also be present. In contrast, when an element is referred to as being "directly connected" to another element, there are no intervening elements present.

Figure 1:
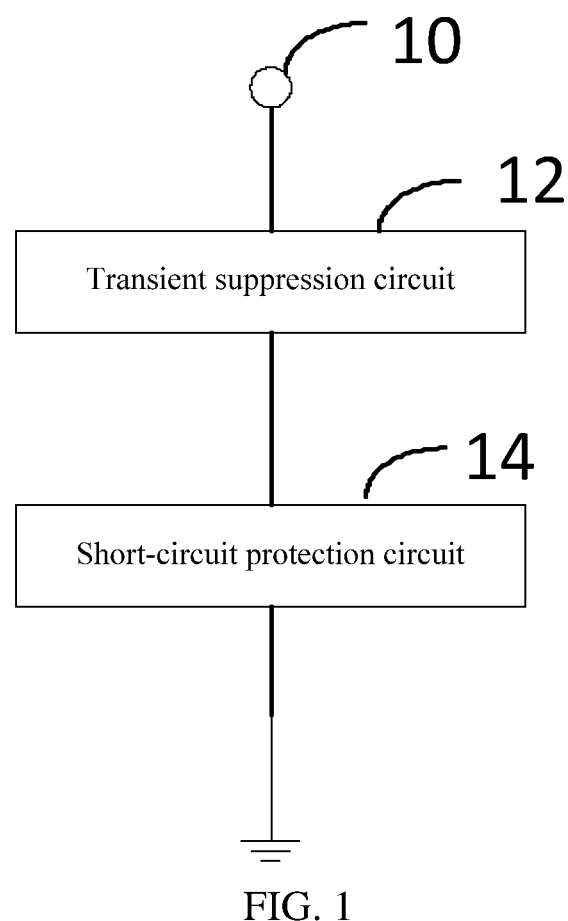
FIG. 1 is a block diagram of a protection circuit in an embodiment.

In an embodiment, as shown in FIG. 1, a protection circuit includes a transient suppression circuit 12 and a short-circuit protection circuit 14. The short-circuit protection circuit 14 is connected in series between the transient suppression circuit 12 and a ground terminal. The transient suppression circuit 12 is configured to suppress a transient voltage so as to prevent subsequent circuits from being disturbed by a transient high voltage higher than a protection voltage and causing the circuits to be damaged. The short-circuit protection circuit 14 is configured to disconnect a loop where the transient suppression circuit 12 is located when the transient suppression circuit 12 is destroyed to be short-circuited and the transient voltage is the protection voltage.

Specifically, in the case of the normal operation of the transient suppression circuit 12, when the transient voltage is greater than the protection voltage, the transient suppression circuit 12 is reversely broken down with its impedance being abruptly lowered at an extremely high speed, while absorbing a large current and clamping a voltage across its two ends at a predetermined value, thereby ensuring the following circuit elements from being damaged by the impact of transient high energy, to protect the subsequent circuits. When the transient high voltage disappears, the transient suppression circuit 12 returns to a high impedance state again. When impacted by another transient high voltage, the transient suppression circuit 12 repeats the operation described above. When the transient voltage is the protection voltage, the transient suppression circuit 12 appears as being in the high impedance state, which will not affect the normal operation of the normally operating system of the subsequent circuits. Therefore, the setting of the protection voltage can be realized by configuring the transient suppression circuit 12. When the transient voltage is greater than the protection voltage, the transient suppression circuit 12 appears as being in a low impedance state, thereby forming a loop discharging, and further enabling the voltage loaded into the subsequent circuits, that is, the protected circuit, to be within the protection voltage, thus realizing the protection of the subsequent circuits. When the transient voltage is the protection voltage, the transient suppression circuit 12 appears as being in the high impedance state, which will not affect the normal operation of subsequent circuits.

When the elements in the transient suppression circuit 12 are damaged to be short-circuited, the short-circuit protection circuit 14 plays a protective role to ensure the normal operation of subsequent circuits. Specifically, the short-circuit protection circuit 14 is configured to control the loop where the transient suppression circuit 12 is located to be disconnected when the transient suppression circuit 12 is destroyed to be short-circuited and the transient voltage is the protection voltage, thereby preventing the protected signal from being short-circuited to the ground and ensuring the normal operation of subsequent circuits.

Optionally, in an embodiment, the short-circuit protection circuit 14 has two states including an on state and an off state. In the case where elements in the transient suppression circuit 12 are not damaged, when the transient voltage is the protection voltage, the elements in the transient suppression circuit 12 may not be reversely broken down. At this time the transient suppression circuit 12 is equivalent to an open circuit and the transient suppression circuit 12, the short-circuit protection circuit 14 do not operate, and the system operates normally. When the transient high voltage is greater than the protection voltage, the elements in the transient suppression circuit 12 are reversely broken down, and the impedance of the transient suppression circuit 12 abruptly drops. At this time, the short-circuit protection circuit 14 is in the on state, thereby causing the loop where the transient suppression circuit 12 is located to absorb a large current and to play a role of clamping the voltage, thus playing the role of protecting the following circuit elements.

The transient suppression circuit 12 may be damaged by of a high voltage for a long time or an instantaneous excessively high voltage, and may appear as being in a short-circuit state. When the transient voltage is the protection voltage, the short-circuit protection circuit 14 is in the off state, thereby ensuring that the input normal signal will not pass through the loop where the transient suppression circuit 12 in the short-circuit state is located and the system operates normally. When the transient voltage is greater than the protection voltage, the short-circuit protection circuit 14 is in an on state, thereby ensuring that the transient high voltage passes through the loop where the transient suppression circuit 12 is located, so as to avoid the impact of the transient high voltage on the subsequent circuit elements and ensure the normal operation of the subsequent circuit.

Figure 2:
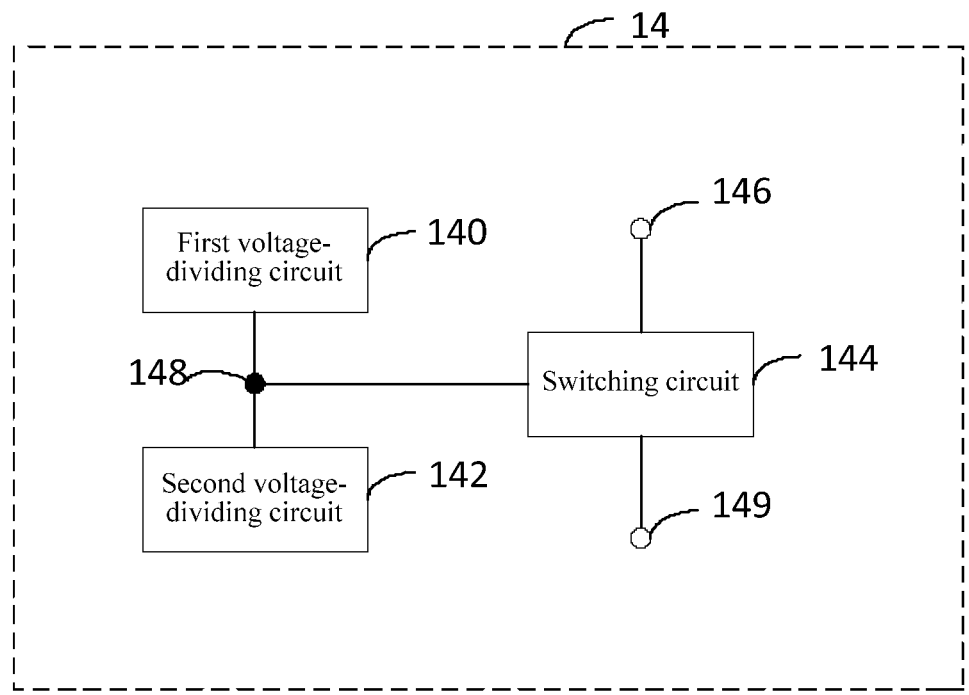
FIG. 2 is a block diagram of a short-circuit protection circuit in an embodiment.

Optionally, in an embodiment, as shown in FIG. 2, the short-circuit protection circuit 14 includes a first voltage-dividing circuit 140, a second voltage-dividing circuit 142 and a switching circuit 144. The first voltage-dividing circuit 140 and the second voltage-dividing circuit 142 are sequentially connected in series between the transient suppression circuit 12 and the ground terminal. The control terminal 148 of the switching circuit 144 is connected between the first voltage-dividing circuit 140 and the second voltage-dividing circuit 142, the input terminal 146 is connected to the transient suppression circuit 12, and the output terminal 149 is connected to the ground terminal. The first voltage-dividing circuit 140 and the second voltage-dividing circuit 142 cooperate to control the switching circuit 144 to be in the on state when the transient suppression circuit 12 is short-circuited and the transient voltage is greater than the protection voltage, and to be in the off state when the transient suppression circuit 12 is short-circuited and the transient voltage is the protection voltage.

Figure 3:
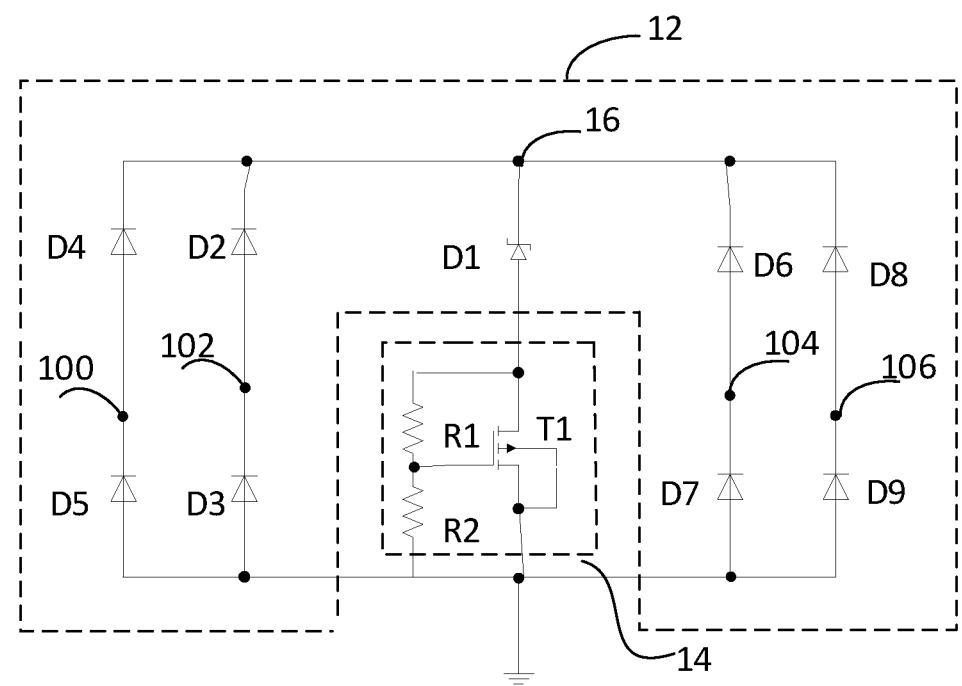
FIG. 3 is a circuit diagram of a protection circuit in an embodiment.

Specifically, in an embodiment, the first voltage-dividing circuit 140 includes a first resistor R1 and the second voltage-dividing circuit 142 includes a second resistor R2, as shown in FIG. 3. In another embodiment, the first voltage-dividing circuit 140 may also be a resistor circuit consisting of two or more resistors connected in series or in parallel. Likewise, the second voltage-dividing circuit 142 may be a resistor circuit consisting of two or more resistors connected in series or in parallel, which is not limited to this embodiment.

In another embodiment, the switching circuit 144 is a PMOS transistor T1. A gate of the PMOS transistor T1 operates as the control terminal 148 of the switching circuit 144, a source of the PMOS transistor T1 operates as the input terminal 146 of the switching circuit 144, and a drain of the PMOS transistor T1 operates as the output terminal 149 of the switching circuit 144, as shown in FIG. 3.

Optionally, in an embodiment, a threshold voltage of the PMOS transistor T1 is −0.6V, that is, when the voltage between the gate and the drain of the PMOS transistor T1 is greater than −0.6V, the PMOS transistor T1 is in an on state, otherwise in an off state. A ratio between resistances of the first voltage-dividing circuit 140 and the second voltage-dividing circuit 142 is 1 to 7. Assuming a TTL high level of 3.3V to be protected, when the elements in the transient suppression circuit 12 are not damaged, the elements in the transient suppression circuit 12 will be reversely broken down if the transient voltage is greater than the protection voltage. Due to the voltage-dividing effect of the first voltage-dividing circuit 140 and the second voltage-dividing circuit 142, as long as the voltage loaded onto the source is greater than 4.2V, the voltage Vgs across the gate and the drain can be greater than −0.6V, and the PMOS transistor T1 is turned on to form a discharging loop. At this time, the transient suppression circuit 12 is reversely broken down with its impedance being abruptly lowered at an extremely high speed, while absorbing a large current and clamping the voltage across its two ends at a predetermined value, thereby ensuring the following circuit elements from being damaged by the impact of transient high energy to protect the circuits. When the transient voltage disappears, the transient suppression circuit 12 returns to a high impedance state again. When impacted by another transient voltage, the transient suppression circuit 12 repeats the operation described above. When the transient voltage is the protection voltage, the transient suppression circuit 12 appears as being in the high impedance state, which will not affect the normal operation of the normally operating system of the subsequent circuits.

When the elements in the transient suppression circuit 12 are damaged, if the transient voltage is greater than the protection voltage, the voltage Vgs across the gate and the drain of the PMOS transistor T1 can be greater than −0.6V due to the voltage-dividing effect of the first voltage-dividing circuit 140 and the second voltage-dividing circuit 142, and the PMOS transistor T1 is turned on, thereby ensuring the transient high voltage to pass through the loop where the transient suppression circuit 12 is located, to avoid the impact of the transient high voltage on subsequent circuit elements and ensuring the normal operation of subsequent circuits. If the transient voltage is the protection voltage, the conduction condition of the PMOS transistor T1 cannot be reached at this time and the PMOS transistor T1 is turned off. And since the PMOS transistor T1 cannot be turned on, the short-circuit protection circuit 14 is in the off state, thus ensuring that the input normal signal will not pass through the loop where the transient suppression circuit 12 in the short-circuit state is located and the system operates normally.

In an embodiment, the transient suppression circuit 12 includes a steering diode array and a voltage regulator diode. The steering diode array consists of eight transient suppression diodes (D2-D9) every two of which are connected in series with each other and then connected in parallel. The voltage regulator diode and the steering diode array are connected in parallel to form a transient suppression circuit 12. The input terminal 16 is connected to the power or the ground. The protection circuit may have four input terminals, including input terminals 100, 102, 104, and 106, that is, this circuit can protect multiple input signals at the same time. The steering diode can protect the input signal 10 whether it is a positive signal or a negative signal. For example, when a positive voltage is input into the input terminal 102, the current flows to the diode D2, and when a negative voltage is input into the input terminal 102, the current flows to the diode D3.

In an embodiment, the above-described transient suppression circuit 12 is a transient suppression chip, that is, the steering diode array and the voltage regulator diode D1 are packaged together.

In an embodiment, the short-circuit protection circuit 14 may be integrated inside the transient suppression chip described above. At this time, the protection circuit operates as an independent transient suppression chip (TVS).

Technical features in the foregoing embodiments may be combined randomly. For the brevity of description, not all possible combinations of various technical features in the foregoing embodiments are described. However, as long as combinations of these technical features do not contradict each other, it should be considered that the combinations all fall within the scope of this specification.

The foregoing embodiments only show several implementations of this application and are described in detail, but they should not be construed as a limit to the patent scope of this application. It should be noted that, persons of ordinary skill in the art may make various changes and improvements without departing from the ideas of this application, which shall all fall within the protection scope of this application. Therefore, the protection scope of the patent of this application shall be subject to the appended claims.

What is claimed is:

1. A protection circuit, comprising:
   a transient suppression circuit configured to suppress a transient voltage; and
   a short-circuit protection circuit connected between the transient suppression circuit and a ground terminal,
   wherein the short-circuit protection circuit disconnects a loop where the transient suppression circuit is located when the transient suppression circuit is short-circuited and the transient voltage is a protection voltage;
   wherein the short-circuit protection circuit comprises a first voltage-dividing circuit, a second voltage-dividing circuit and a switching circuit; the first voltage-dividing circuit and the second voltage-dividing circuit are sequentially connected in series between the transient suppression circuit and the ground terminal; a control terminal of the switching circuit is connected between the first voltage-dividing circuit and the second voltage-dividing circuit; an input terminal of the switching circuit is connected to the transient suppression circuit; an output terminal of the switching circuit is connected to the ground terminal; and the first voltage-dividing circuit and the second voltage-dividing circuit cooperatively control the switching circuit to be in the on state when the transient suppression circuit is short-circuited and the transient voltage is greater than the protection voltage, and to be in the off state when the transient suppression circuit is short-circuited and the transient voltage is the protection voltage;
   the switching circuit comprises a PMOS transistor; a gate of the PMOS transistor operates as the control terminal; a source of the PMOS transistor operates as the input terminal; and a drain of the PMOS transistor operates as the output terminal; and
   the PMOS transistor has a threshold voltage of −0.6 volt; and a ratio between resistances of the first voltage-dividing circuit and the second voltage-dividing circuit is 1:7.

2. The protection circuit according to claim 1, wherein the first voltage-dividing circuit comprises a first resistor.

3. The protection circuit according to claim 1, wherein the second voltage-dividing circuit comprises a second resistor.

4. The protection circuit according to claim 1, wherein: the transient suppression circuit comprises a steering diode array and a voltage regulator diode; the steering diode array comprises eight transient suppression diodes; every two of the eight transient suppression diodes are connected in series with each other and then connected in parallel; the voltage regulator diode is connected in parallel with the steering diode array; and the short-circuit protection circuit is connected in series with the voltage regulator diode and is grounded.

5. The protection circuit according to claim 4, wherein: the protection circuit comprises a plurality of signal input terminals, and the signal input terminals are disposed between the every two transient suppression diodes connected in series with each other; and the signal input terminals are configured to input an input signal to the protection circuit.

6. The protection circuit according to claim 5, wherein the input signal is a voltage signal.

7. The protection circuit according to claim 1, wherein the transient suppression circuit is a transient suppression chip.

8. The protection circuit according to claim 7, wherein the short-circuit protection circuit is integrated within the transient suppression chip.

9. A protection circuit, comprising:
a transient suppression circuit configured to suppress an input transient voltage within a protection voltage; and
a short-circuit protection circuit connected between the transient suppression circuit and a ground terminal,
wherein: the short-circuit protection circuit comprises a first voltage-dividing circuit, a second voltage-dividing circuit and a switching circuit; the first voltage-dividing circuit and the second voltage-dividing circuit are sequentially connected in series between the transient suppression circuit and the ground terminal; a control terminal of the switching circuit is connected between the first voltage-dividing circuit and the second voltage-dividing circuit; an input terminal of the switching circuit is connected to the transient suppression circuit; an output terminal of the switching circuit is connected to the ground terminal; the first voltage-dividing circuit and the second voltage-dividing circuit cooperatively control the switching circuit to be in an on state when the transient suppression circuit is short-circuited and the transient voltage is greater than the protection voltage, and to be in an off state when the transient suppression circuit is short-circuited and the transient voltage is the protection voltage;
the switching circuit comprises a PMOS transistor; a gate of the PMOS transistor operates as the control terminal; a source of the PMOS transistor operates as the input terminal; and a drain of the PMOS transistor operates as the output terminal; and
the PMOS transistor has a threshold voltage of −0.6 volt; and a ratio between resistances of the first voltage-dividing circuit and the second voltage-dividing circuit is 1:7.

10. The protection circuit according to claim 9, wherein: the transient suppression circuit comprises a steering diode array and a voltage regulator diode; the steering diode array comprises eight transient suppression diodes; every two of the eight transient suppression diodes are connected in series with each other and then connected in parallel; the voltage regulator diode is connected in parallel with the steering diode array; and the short-circuit protection circuit is connected in series with the voltage regulator diode and is grounded.

11. The protection circuit according to claim 10, wherein: the protection circuit comprises a plurality of signal input terminals, and the signal input terminals are disposed between the every two transient suppression diodes connected in series with each other; and the signal input terminals are configured to input an input signal to the protection circuit.

12. The protection circuit according to claim 11, wherein the input signal is a voltage signal.

* * * * *